United States Patent
Yilmazoglu et al.

(10) Patent No.: US 11,917,931 B2
(45) Date of Patent: Feb. 27, 2024

(54) GUNN DIODE AND METHOD FOR GENERATING A TERAHERTZ RADIATION

(71) Applicant: TECHNISCHE UNIVERSITAT DARMSTADT, Darmstadt (DE)

(72) Inventors: Oktay Yilmazoglu, Groß-Zimmern (DE); Ahid S. Hajo, Darmstadt (DE)

(73) Assignee: Technische Universität Darmstadt, Darmstadt (DE)

(*) Notice: Subject to any disclaimer, the term of this patent is extended or adjusted under 35 U.S.C. 154(b) by 497 days.

(21) Appl. No.: 17/272,560

(22) PCT Filed: Aug. 23, 2019

(86) PCT No.: PCT/EP2019/072556
§ 371 (c)(1),
(2) Date: Mar. 1, 2021

(87) PCT Pub. No.: WO2020/048792
PCT Pub. Date: Mar. 12, 2020

(65) Prior Publication Data
US 2021/0328143 A1 Oct. 21, 2021

(30) Foreign Application Priority Data
Sep. 5, 2018 (DE) .................. 10 2018 121 672.6

(51) Int. Cl.
*H10N 80/10* (2023.01)
*H03B 7/08* (2006.01)

(52) U.S. Cl.
CPC .......... *H10N 80/107* (2023.02); *H03B 7/08* (2013.01)

(58) Field of Classification Search
CPC ....... H10N 80/107; H10N 80/103; H03B 7/08
See application file for complete search history.

(56) References Cited

U.S. PATENT DOCUMENTS

| 3,440,425 A | 4/1969 | Hutson et al. |
| 3,555,282 A | 1/1971 | Yanai et al. |

(Continued)

FOREIGN PATENT DOCUMENTS

| CN | 101478006 A | 7/2009 |
| CN | 105514176 A | 4/2016 |

(Continued)

OTHER PUBLICATIONS

Depth profiling of strain and carrier concentration by cleaved surface scanning of GaN Gunn-diode: confocal Raman microscopy, Authors: Belyaev A E, Strelchuk V V, Nikolenko A S, Romanyuk A S, Yu I Mazur, Ware ME, DeCuir Jr E A, Salamo G J, Publication data: Semiconductor Science Technology, ,Aug. 16, 2013, IOP Publishing Ltd, GB, Source info: vol. 28, Nr: 10, pp. 105011.

(Continued)

*Primary Examiner* — Elias Ullah
(74) *Attorney, Agent, or Firm* — Smartpat PLC

(57) ABSTRACT

The invention relates to a Gunn diode comprising a first contact layer (110); a second contact layer (120); an active layer (130) based on a gallium nitride (GaN)-based semiconductor material, said active layer being formed between the first contact layer (110) and the second contact layer (120); a substrate (140) on which the active layer (130) is formed together with the first contact layer (110) and the second contact layer (120); and an optical inlet (150) for a laser (50) in order to facilitate or trigger a charge carrier transfer between extrema (210, 220) of the energy bands of the active layer (130) by means of laser irradiation.

14 Claims, 6 Drawing Sheets

(56) References Cited

U.S. PATENT DOCUMENTS

| | | | |
|---|---|---|---|
| 3,573,469 A | 4/1971 | Riesz | |
| 3,806,947 A | 4/1974 | Syeles et al. | |
| 4,625,182 A | 11/1986 | Bovino et al. | |
| 2002/0117681 A1* | 8/2002 | Weeks | H01L 29/802 |
| | | | 257/E29.022 |
| 2010/0163837 A1 | 7/2010 | Yilmazoglu et al. | |
| 2020/0287356 A1* | 9/2020 | Kishimoto | B23K 26/034 |

FOREIGN PATENT DOCUMENTS

| | | |
|---|---|---|
| GB | 1187563 A | 4/1970 |
| GB | 1188986 A | 4/1970 |
| GB | 1302763 A | 1/1973 |
| IN | 104681721 A | 6/2015 |
| WO | 2008095639 A1 | 8/2008 |

OTHER PUBLICATIONS

Evtukh, A. & Yilmazoglu, Oktay & Litovchenko, V.G. & Semenenko, Mykola & Kyriienko, Oleksandr & Hartnagel, Hans & Pavlidis, D . . . (2010). Peculiarities of the photon-assisted field emissions from GaN nanorods. Journal of Vacuum Science & Technology B—J Vac Sci Technol B. 28. 10.1116/1.3368463.

Liang, Li [ et al.]: Point defect determination by photoluminescence and capacitance-voltage characterization in a GaN terahertz Gunn diode. In: Chin. Phys. B, vol. 22, 2013, No. 8, Art. 087104, S. 1 bis 5.

* cited by examiner

GUNN DIODE AND METHOD FOR GENERATING A TERAHERTZ RADIATION

CROSS REFERENCE TO RELATED APPLICATIONS

This is a U.S. National Stage Application, filed under 35 U.S.C. 371, of international Patent Application No. PCT/EP2019/072556, filed on Aug. 23, 2019, which claims priority to German patent application No. 10-2018-121-672.6, filed Sep. 5, 2018, the contents of which are incorporated herein by reference in their entireties.

Exemplary embodiments of the present invention relate to a Gunn diode, a switch for generating terahertz radiation (THz radiation) and a method for generating THz radiation and in particular on a GaN Gunn diode with laser irradiation and field plate technology.

BACKGROUND

The Gunn effect has been successfully used in GaAs or InP-based semiconductor components to generate high frequency signals. These semiconductor materials have material properties such as energy band courses, charge carrier speeds and movability which initiate the electron transfer of the Gunn effect.

Gunn diodes use this effect by causing through suitable wiring (e.g. applying a corresponding supply voltage) electrons to accumulate and migrate in batches (such as waves) through the diode. This in turn results in generation and subsequent radiation of electromagnetic waves in accordance with this frequency.

In particular for very high frequencies (e.g. in the terahertz range), known GaAs-based semiconductor components have a series of disadvantages. These are justified in that saturation speed for electrons and electron transfer times are too low for these high frequencies. Therefore, these semiconductor components can hardly be used for frequencies in the terahertz range. Furthermore, the electric threshold field intensity for the so-called "electron transfer effect" or the energy band gap are too small for high output powers.

Since there is also a growing need for THz radiation sources, it is desirable to find alternatives to the GaAs-based semiconductor components.

BRIEF DESCRIPTION OF THE INVENTION

At least one part of the above-mentioned problems is resolved by a Gunn diode according to claim 1, by a switch according to claim 10 and a method according to claim 14. The dependent claims define other advantageous embodiments for the subject matters of the independent claims.

The present invention relates to a Gunn diode with a first contact layer, a second contact layer, an active layer, a substrate and an optical input. The active layer is based on a gallium nitride (GaN)-based semiconductor material (e.g. $Al_xIn_yGa_{1-x-y}N$) and is formed between the first contact layer and the second contact layer.

The active layer with the first contact layer and the second contact layer are formed on the substrate. The optical input is formed to receive a laser light in order to facilitate or trigger a charge carrier transport between energy bands of the active layer by means of laser irradiation.

The GaN-based semiconductor materials, which are used for the active layer, can in particular comprise the following: a binary compound semiconductor (i.e. GaN), a ternary compound semiconductor (e.g. AlGaN, InGaN) or a quaternary compound semiconductor (e.g. AlInGaN) or other compound semiconductors with even more components, but GaN as one constituent.

The substrate optionally comprises one of the following materials: Gallium nitride, silicon, silicon carbide.

Optionally, the Gunn diode also comprises an anode contact (anode electrode) and a cathode contact (cathode electrode). The first contact layer and/or the second contact layer can be higher doped regions of the same base material in comparison to the active layer. The anode contact can optionally be formed on a rear side of the substrate such that it is (electrically) connected via the substrate to the first contact layer. The cathode contact can electrically contact the second contact layer. For example, the first contact layer and the second contact layer comprise a doping in a range of $1 \times 10^{18}$ cm$^{-3}$ to $5 \times 10^{18}$ cm$^{-3}$ and the anode contact a doping of at least $10^{20}$ cm$^{-3}$. The active layer can also be doped in order to generate the desired band structure. Optionally, the first contact layer can be formed by a substrate. Without the invention being limited to this, the doping can for example be carried out with silicon (many other materials are, however, possible).

Optionally, the Gunn diode also comprises a cooling body (active or passive) which has a higher heat conductivity than that of the substrate in order to form a heat sink. A thermal connection of the active layer with the cooling body can be produced via the substrate.

Optionally, the Gunn diode also comprises a field plate, which in particular has a metal, with the active layer being formed between the field plate and the substrate, without protruding laterally over the field plate. The field plate causes homogenization of the field in the active range of the Gunn diode. In particular field enhancements at corners and edges are avoided as a result (e.g. at the edge of the Gunn diode). The field plate can for example have chromium or gold or another material or a plurality of layers thereof.

Optionally, the Gunn diode also comprises a passivation layer which is arranged in such manner that the active layer is formed with the first contact layer and the second contact layer between the passivation layer and the substrate.

Optionally, the optical input is formed by a material that is transparent for the laser. In particular, at least one of the following components can be formed with a material that is transparent for the laser:
the first contact layer,
the second contact layer,
the passivation layer.

These layers or parts thereof can also be formed as waveguides to feed the laser radiation to the active region.

Exemplary embodiments also relate to a switch for generating terahertz radiation with a Gunn diode, as have been described above. The switch can also have the laser (e.g. as an integral constituent), with the laser being coupled with the optical input and formed in order to generate a continuous laser beam or a pulsed laser beam. In this way, a continuous or pulsed THz beam can also be generated. Similarly, a control unit can be provided to actuate the laser and/or the Gunn diode.

The laser can for example generate an infrared light or an ultraviolet light. The laser can, however, also operate in the visible spectral range. Optionally, the laser is pulsed and has a laser rise time in the nanosecond range or picosecond range or femtosecond range in order to thereby trigger the desired THz radiation.

Exemplary embodiments also relate to a terahertz radiation source with a previously described switch and an (integrated) antenna.

Exemplary embodiments also relate to a method for generating terahertz radiation. The method comprises:
   applying a supply voltage to a Gunn diode, as has been described above; and
   irradiating the Gunn diode with a laser beam in order to trigger or support a charge carrier transfer in the active layer of the Gunn diode.

Optionally, the supply voltage can be applied permanently, e.g. when the laser beam is pulsed. The supply voltage can also have an operating frequency, e.g. when a continuous laser beam is used.

BRIEF DESCRIPTION OF THE FIGURES

The exemplary embodiments of the present invention will be better understood on the basis of the following detailed description and the accompanying drawings of the different exemplary embodiments, which should, however, not be understood such that they limit the disclosure to the specific embodiments, but rather they merely serve for explaining and understanding.

DETAILED DESCRIPTION

Figure 1:
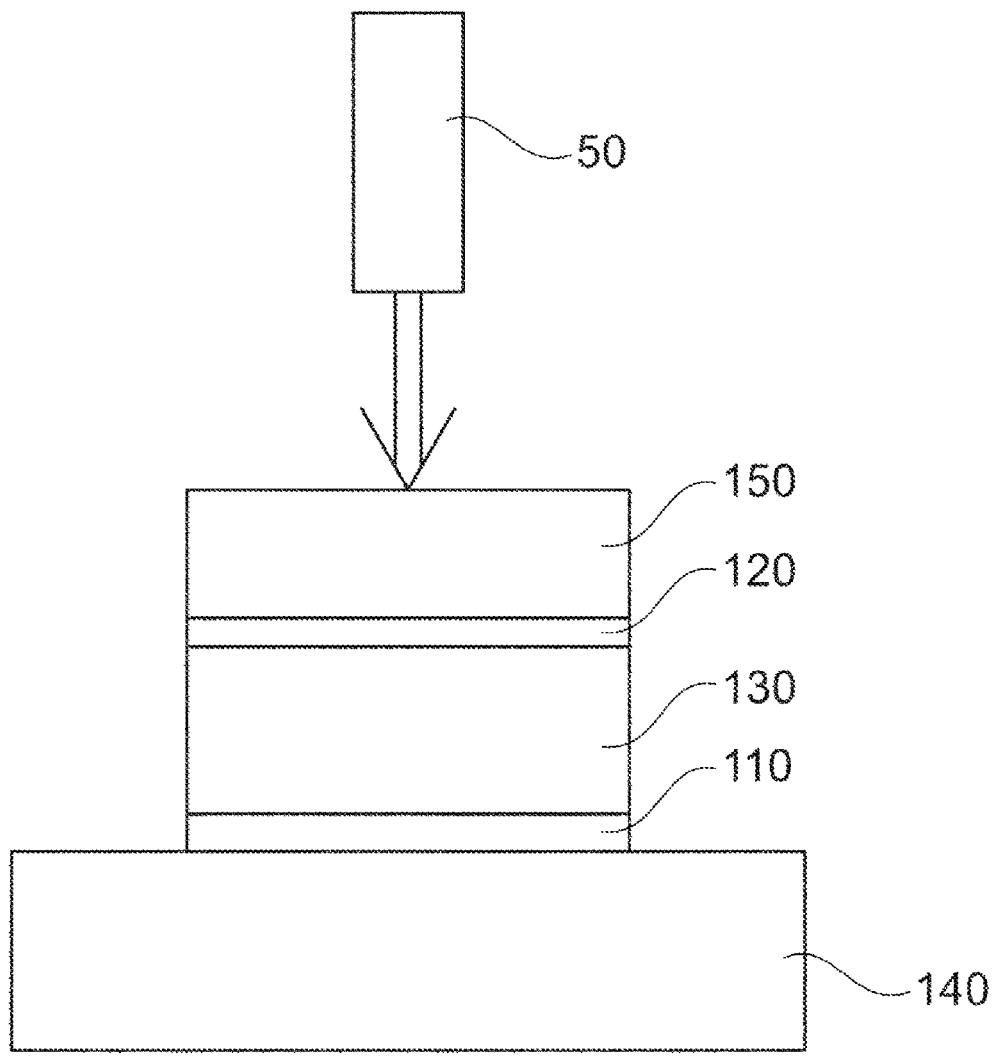
FIG. 1 shows a Gunn diode according to an exemplary embodiment of the present invention.

FIG. 1 shows a Gunn diode according to an exemplary embodiment of the present invention.

The Gunn diode comprises: a first contact layer 110, a second contact layer 120 and an active layer 130 based on a gallium nitride (GaN)-based semiconductor material which is formed between the first contact layer 110 and the second contact layer 120. The Gunn diode also comprises a substrate 140 on which the active layer 130 is formed with the first contact layer 110 and the second contact layer 120, and an optical input 150 for a laser 50 in order to facilitate or trigger a charge carrier transfer between extrema (minima for electrons; maxima for holes) of energy bands of the active layer 130 by means of laser irradiation.

The first contact layer 110 or the second contact layer 120 can form the anode contact or therefore be electrically connected. The cathode contact is then electrically connected to the respectively other contact layer or it forms said contact layer. The active layer 130 and optionally also the contact layers 110, 120 can be formed with more or less strong doping (p-doping or n-doping). The GaN-based semiconductor material can have other elements which are selectively introduced to further promote the effect described below.

Figure 2:
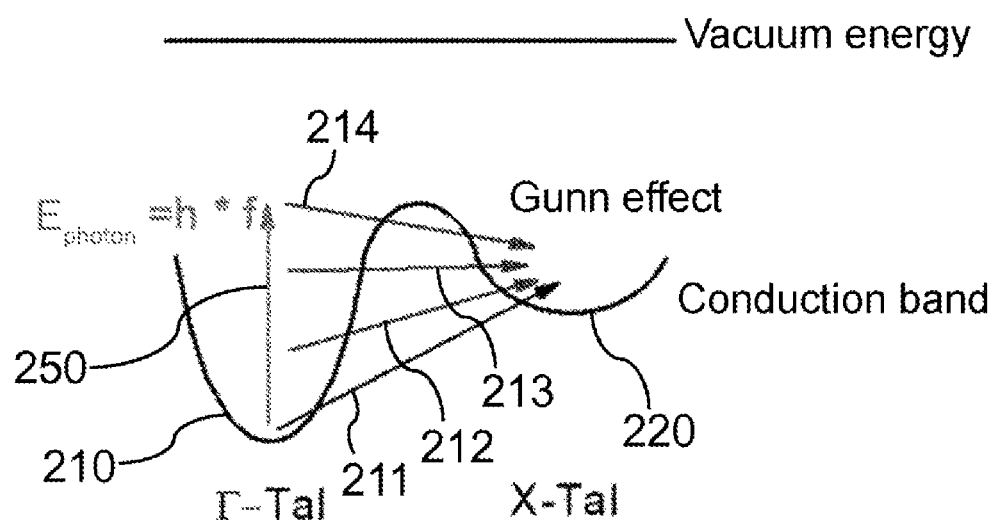
FIG. 2 illustrates the Gunn effect, which occurs in certain semiconductor materials and according to the exemplary embodiments is used to generate THz radiation.

FIG. 2 illustrates the Gunn effect, which occurs in certain semiconductor materials and according to the exemplary embodiments is used to generate THz radiation. The energy bands of the corresponding semiconductor materials have relative maxima or minima at a low energetic distance. Electrons (or even holes), which are excited for example from a valence band into a conduction band, are firstly located in a first minimum 210 (e.g. an absolute minimum of the so-called T-valley) of the conduction band. If the exemplary electrons in an electric field reach an energy which is in the range of the energy differential between the first minimum 210 and second (relative) minimum 220 (e.g. so-called X-valley), they will be transferred by means of scattering (e.g. of optical phonons) into the adjacent minimum 220 (see first transition 211). The electric field can for example be generated by applying a voltage. Since for these materials the exemplary electrons have a high effective mass in the adjacent minimum, the so-called side valley, (due to the energy band curvature), they have a lower movability there. For this reason, the electric current notably declines, in spite of increasing voltage. That is to say that a negative differential resistance results.

The transition from the L-valley 210 to the X-valley 220 is, according to exemplary embodiments, further facilitated as a result of the Gunn diode being irradiated by means of a laser. As a result, the charge carriers in the L-valley 210 receive additional energy which is proportional to the frequency f of the laser beam (ephoton=h*f). This energy intake 250 facilitates the transition into the X-valley 220. If the first transition 211 represents a transition without laser excitation, the second, third and fourth transition 212, 213, 214 is facilitated by the absorbed energy 250 with increasing frequency.

Exemplary embodiments use this to trigger the transition by means of the laser beam or to at least support it such that the transition is carried out for as many charge carriers as possible in a short time.

Due to the rapid drop in power, these components can be used as switches. In contrast to conventional GaAs switches (e.g. GaAs photo switch or GaAs photoconductor), according to exemplary embodiments, the exemplary electrodes are not transferred from the valence band or "deep levels" between the valence and conduction band into the conduction band. In fact, the laser irradiation transfers the electrons from the L-valley 210 (first minimum) in the conduction band to the satellite valley 220 (again in the conduction band).

The essential advantage with this approach is that the transfer can take place in (sub) picoseconds (10 ps or <1 ps). Therefore, very quick changes in power result and the components can therefore be used to generate THz radiation.

The laser irradiation according to exemplary embodiments therefore serves for triggering and/or accelerating the THz radiation from GaN Gunn diodes. Therefore, the stability is increased and the generation of broadband THz beams (50 GHz-more THz) is made possible. For this purpose, a continuous laser beam and/or a pulsed beam can be used with a nano, pico or femtosecond cycle in order to cause/deliver the electron transfer effect (Gunn effect). The pulsed beam therefore offers the advantage of achieving a very quick electron transfer effect.

Figure 3:
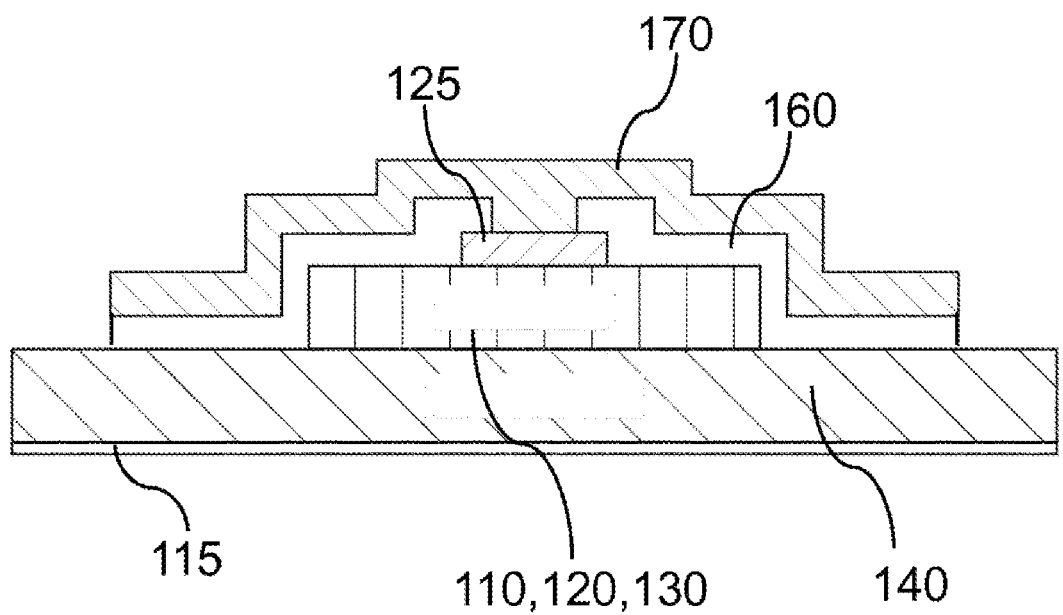
FIG. 3 shows a further exemplary embodiment of the Gunn diode with other optional components.

FIG. 3 shows another exemplary embodiment in which the layer stack of the Gunn diode (first contact layer 110, second contact layer 120, active layer 130) is contacted on the substrate 140 by means of a (cathode) electrode 125. The electrode 125 for its part contacts a field plate 170 which extends over the layer stack 110, 120, 130 of the Gunn diode such that the layer stack 110, 120, 130 is formed between the substrate 140 and the field plate 170 and is exposed to the electric field by means of the applied voltage.

The electrodes 125, like the field plate 170, for example have a metal (one or a plurality of layers). The field plate 170 can for example have chromium or gold. A passivation layer 160 is formed between the field plate 170 and the layer stack 110, 120, 130, which achieves an electrical insulation between the field plate 170 and the layers 110, 120, 130 of the Gunn diode.

Optionally, it is possible that the passivation layer 160 is used as a light waveguide in order to guide the laser beam along the passivation layer 160 to the layer stack 110, 120, 130 of the Gunn diode. Optionally, it is also possible that either the substrate 140 or one or a plurality of contact layers 110, 120 or parts thereof are formed transparent in order to conduct the laser light along these layers. One of these layers can therefore be part of the optical input 150 or represent said part of the optical input.

For the generation of THz radiation, it is particularly advantageous that nitride materials are suitable for much higher frequencies and powers. Using these materials, the following effects can for example be achieved:
 a high saturation speed for electrons (for GaN>2 times higher than in GaAs),
 much higher electric threshold field strength for the so-called "electron transfer effect" (for GaN>50 times higher than in GaAs),
 a large energy band gap,
 while signal sources based on GaAs and InP components each have limit frequencies of 100 GHz or 200 GHz (for the base mode), the calculated limit values for GaN diodes are for example above 700 GHz.

There are many materials suited for the substrate 140. Gunn diodes on sapphire substrates are possible, although they lead to different effects and problems. This includes e.g. the occurrence of electromigration effects and the high series resistances. However, the low heat conductivity of sapphire often makes the implementation of heat sinks difficult. This leads to high DC losses and reduces the reliability. The following are better suited (e.g. due to their good thermal conductivity): Substrates made of GaN, of SiC or of silicon. In particular in combination with the field plate 170, stable negative differential resistances can therefore be achieved.

Figure 4:
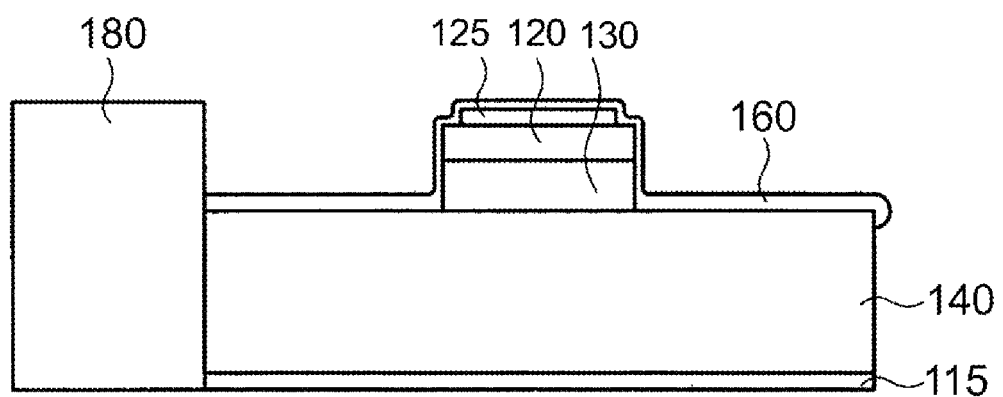
FIG. 4 show another exemplary embodiment of the Gunn diode.

FIG. 4 shows an exemplary embodiment of the present invention in which the active layer 130 is formed directly on the substrate 140 and the substrate 140 itself or regions thereof act like the first contact layer 110. However, an exemplary anode electrode 115 is provided in the exemplary embodiment of FIG. 4 below the substrate 140 (opposite the active layer 130). The power is conducted through the substrate 140 to the Gunn diode. Similarly, an exemplary cathode electrode 125 is formed on the second contact layer 120. A passivation layer 160 is formed over the cathode electrode 125 and the protruding regions of the substrate 140, as in FIG. 3. In this exemplary embodiment, a field plate is not provided, but can also be formed above the passivation layer 160.

The exemplary embodiment of FIG. 4 also comprises an optional cooling body 180, which is formed laterally next to the substrate 140 and represents a cooling sink. The cooling body 180 can provide active cooling (e.g. a fan or a Peltier element) or passive cooling (e.g. cooling fins). The heat flow takes place here over the substrate 140 towards the Gunn diode or towards the active layer 130. For this purpose, it is particularly advantageous when the substrate 140 according to the exemplary embodiments has GaN, Si or SiC (and not sapphire).

Figure 5:
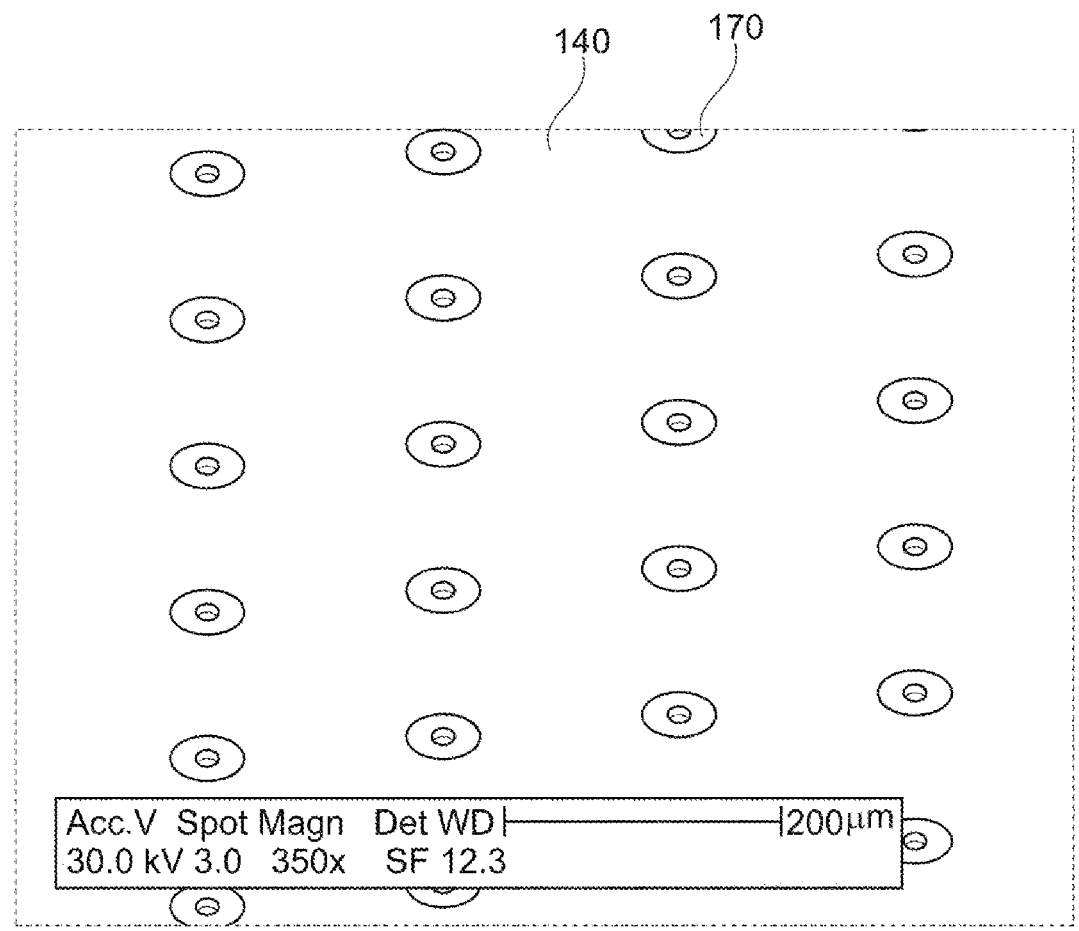
FIG. 5 shows by way of example an array production of the Gunn diodes according to exemplary embodiments.

FIG. 5 shows by way of example production of the Gunn diode from an array of Gunn diodes on only one substrate. By way of example, many field plates 170 separated from one another are represented here, which are formed on the underlying substrate 140. The Gunn diodes themselves each extend here as a protrusion from the substrate 140.

Figure 6:
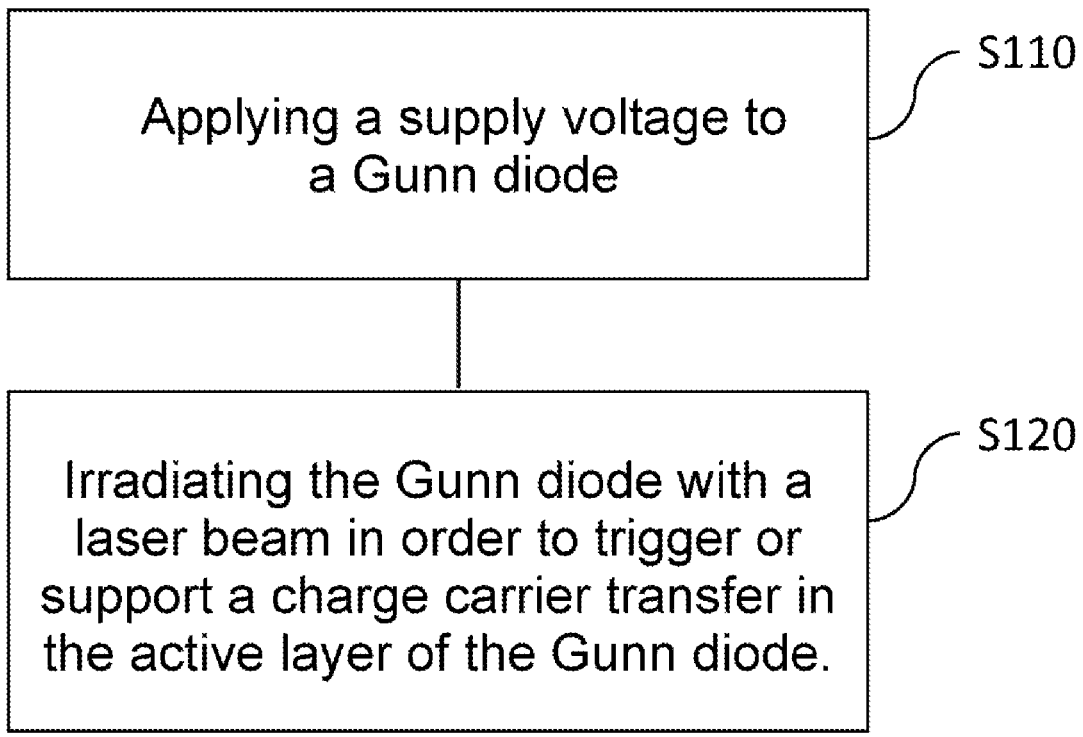
FIG. 6 shows a flow diagram for a method for generating THz radiation according to exemplary embodiments of the present invention.

FIG. 6 shows a flow diagram for a method for generating THz radiation. The method comprises the steps:
 applying S110 a supply voltage to a Gunn diode, as has been described above; and
 irradiating S120 the Gunn diodes with a laser beam in order to trigger or support a charge carrier transfer in the active layer 130 of the Gunn diode.

The supply voltage can be constant or timed at an operating frequency. According to exemplary embodiments, it is also possible that the Gunn effect is triggered by means of a pulsed laser beam, and in this case, the supply voltage can be permanently applied.

The advantages of exemplary embodiments can be summarized as follows:
 compared to conventional GaAs switches, much greater changes in power can be stably and quickly switched.
 since the output power is proportional to the square of the change in power (P~A $I^2$), THz radiation with high power can be generated.
 Broadband THz radiation can also be generated (broadbands of 50 GHz to multiple THz), with an integrated broadband antenna being sufficient for THz radiation.
 Using field plate technology, a uniform supply of the Gunn diode is possible because the parasitic electric field enhancements on the diode edge and the electromigration effects are minimized. Quick destruction of the components as a result of the electromigration effects from the anode to the cathode in the case of high field strengths can be prevented such that the reliability is significantly increased. Using field plate technology on the diode, the required high electric field strengths are more stably applied to the Gunn diode.
 GaN Gunn diode on substrates with improved heat conductivity such as GaN, Si and SiC (higher than on sapphire) can be produced without problems. The high losses of power that are common in Gunn diodes can therefore be better dissipated.
 The Gunn diodes on the new substrates (GaN, Si, SiC) show a stable power-voltage characteristic curve with a well-pronounced negative differential resistance. Due to the high thermal conductivity, heat sinks can be better implemented with a larger outer contact.
 Much greater field strengths than the threshold field strength can be used.
 The use or the integration with the suitable resonator and corresponding pre-loading and signal coupling devices can lead to the generation of millimeter waves up to high THz frequencies with high powers.

Advantages of the laser radiation:
 Using a continuous laser beam (infrared to ultraviolet), the electrons in the conduction band can have greater energy and more easily carry out the electron transfer effect (Gunn effect). Therefore, the required operating voltage of the Gunn diode reduces. The THz generation is facilitated and is stabilized, but the output power reduces.
 Using a pulsed laser beam (infrared to ultraviolet) in the nanosecond range, the heat development can be significantly restricted. The THz generation is again facilitated and stabilized. GaN Gunn diodes can be fed with a separately produced high-voltage source with pulse widths of 40 nanoseconds. The supply voltage can be applied permanently in the case of the pulsed laser beam.

Both methods stabilize the original GaN Gunn diode, and the operating frequency can be set with an external resonator. The pulsed lasers can be used with a laser rise time in the pico or femtosecond range. This allows a very quick electron transfer effect.

Exemplary embodiments can therefore be used in particular for THz switches which, similar to the THz switches based on GaAs photo switches or GaAs photoconductors, can generate the THz beam through quick changes in power.

Since exemplary embodiments for producing and using GaN Gunn diodes make possible the generation of extremely high THz frequencies and high output powers (much higher than for GaAs and InP Gunn diodes), various imaging and spectroscopic applications are therefore possible in the THz frequency range.

The features of the invention disclosed in the description, the claims and the figures may be essential for implementing the invention both individually and also in any combination.

LIST OF REFERENCE NUMERALS

50 Laser
110, 120 Contact layers
115, 125 Electrode(s) (cathode contact/anode contact)
130 Active layer
140 Substrate
150 Optical input
160 Passivation
170 Field plate
180 Cooling body
210, 220 Minima of the conduction band
211,212, . . . Transitions between the minima of the conduction band

The invention claimed is:

1. A Gunn diode, comprising:
a first contact layer (110) and a second contact layer (120);
an active layer (130) based on a gallium nitride (GaN) semiconductor material which is formed between the first contact layer (110) and the second contact layer (120);
a substrate (140) on which the active layer (130) is formed with the first contact layer (110) and the second contact layer (120);
an optical input (150) for a laser (50) in order to facilitate or trigger a charge carrier transfer between extrema (210, 220) of the energy bands of the active layer (130) by means of laser irradiation; and
a field plate (170), made of metal, wherein the active layer (130) is formed between the field plate (170) and the substrate (140), without protruding laterally over the field plate (170).

2. The Gunn diode according to claim 1, wherein the substrate comprises one of the following materials: Gallium nitride, silicon, silicon carbide.

3. The Gunn diode according to claim 1, further comprising an anode contact and a cathode contact,
wherein the first contact layer (110) and/or the second contact layer, in comparison to the active layer (130), are higher doped regions of the same base material and the anode contact is electrically connected via the substrate (140) to the first contact layer (110) and the cathode contact is electrically connected to the second contact layer, and
wherein the first contact layer (110) and the second contact layer (120) comprise doping in a range of $1 \times 10^{18}$ cm$^{-3}$ to $5 \times 10^{18}$ cm$^{-3}$ and the anode contact comprises a doping of at least $10^{20}$ cm$^{-3}$.

4. The Gunn diode according to claim 1, wherein the first contact layer (110) is formed by the substrate (140).

5. The Gunn diode according to claim 1, further comprising
a cooling body (180), which has a higher heat conductivity than that of the substrate (140).

6. The Gunn diode according to claim 5, in which a thermal connection of the active layer (130) to the cooling body (180) is produced via the substrate (140).

7. The Gunn diode according to claim 1, further comprising a passivation layer (160), which is arranged in such manner that the active layer (130) is formed with the first contact layer (110) and the second contact layer (120) between the passivation layer (160) and the substrate (140).

8. A switch for generating terahertz radiation comprising the Gunn diode according to claim 1.

9. A system, comprising:
the switch according to claim 8; and
the laser (50), which is couplable to the optical input (150) and is formed in order to generate a continuous laser beam or a pulsed laser beam.

10. The system according to claim 9, wherein the pulsed laser (50) has a laser rise time in the nanosecond range or picosecond range or femtosecond range.

11. A terahertz radiation source, comprising the switch according to claim 8 and an integrated antenna.

12. A Gunn diode, comprising:
a first contact layer (110) and a second contact layer (120);
an active layer (130) based on a gallium nitride (GaN) semiconductor material which is formed between the first contact layer (110) and the second contact layer (120);
a substrate (140) on which the active layer (130) is formed with the first contact layer (110) and the second contact layer (120); and
an optical input (150) for a laser (50) in order to facilitate or trigger a charge carrier transfer between extrema (210, 220) of the energy bands of the active layer (130) by means of laser irradiation,
wherein the optical input (150) is formed by a material that is transparent for the laser for at least one of the following components:
the first contact layer (110),
the second contact layer (120),
a passivation layer (160) arranged in such manner that the active layer (130) is formed with the first contact layer (110) and the second contact layer (120) between the passivation layer (160) and the substrate (140).

13. A method for generating terahertz radiation, comprising:
providing a Gunn diode, comprising
a first contact layer (110) and a second contact layer (120),
an active layer (130) based on a gallium nitride (GaN) semiconductor material which is formed between the first contact layer (110) and the second contact layer (120),
a substrate (140) on which the active layer (130) is formed with the first contact layer (110) and the second contact layer (120), and
an optical input (150) for a laser (50) in order to facilitate or trigger a charge carrier transfer between extrema (210, 220) of the energy bands of the active layer (130) by laser irradiation;

applying (S110) a supply voltage to the Gunn diode; and
irradiating (S120) the Gunn diode with a laser beam in order to trigger or support a charge carrier transfer in the active layer (130) of the Gunn diode.

14. The method according to claim 13, wherein
the supply voltage is applied permanently, when the laser beam is pulsed, or
is applied at an operating frequency, when the laser beam is a continuous laser beam.

\* \* \* \* \*